United States Patent
Classen et al.

(10) Patent No.: US 9,097,736 B2
(45) Date of Patent: Aug. 4, 2015

(54) MICROMECHANICAL COMPONENT AND METHOD FOR MANUFACTURING A MICROMECHANICAL COMPONENT

(71) Applicant: Robert Bosch GmbH, Stuttgart, DE (US)

(72) Inventors: Johannes Classen, Reutlingen (DE); Arnd Kaelberer, Schlierbach (DE); Lars Tebje, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 275 days.

(21) Appl. No.: 13/658,949

(22) Filed: Oct. 24, 2012

(65) Prior Publication Data
US 2013/0104654 A1    May 2, 2013

(30) Foreign Application Priority Data

Oct. 27, 2011   (DE) .................... 10 2011 085 305
Jan. 19, 2012   (DE) .................... 10 2012 200 740

(51) Int. Cl.
| | |
|---|---|
| *G01P 15/125* | (2006.01) |
| *G01P 15/18* | (2013.01) |
| *B81B 3/00* | (2006.01) |
| *G01P 15/08* | (2006.01) |

(52) U.S. Cl.
CPC ............ *G01P 15/125* (2013.01); *B81B 3/0072* (2013.01); *G01P 15/18* (2013.01); *B81B 2201/025* (2013.01); *G01P 2015/0805* (2013.01); *Y10T 29/49155* (2015.01)

(58) Field of Classification Search
CPC ... G01P 15/125; G01P 15/18; G01P 15/0802; G01P 15/0891; G01P 15/08
USPC .............. 73/514.32, 514.36, 514.38, 510, 73/514.18, 514.24
See application file for complete search history.

(56) References Cited

U.S. PATENT DOCUMENTS

| | | | | |
|---|---|---|---|---|
| 6,845,670 | B1 * | 1/2005 | McNeil et al. | 73/514.32 |
| 7,007,550 | B2 * | 3/2006 | Sakai et al. | 73/514.29 |
| 7,258,012 | B2 * | 8/2007 | Xie | 73/514.32 |
| 7,600,428 | B2 * | 10/2009 | Robert et al. | 73/514.32 |
| 8,020,443 | B2 * | 9/2011 | Lin et al. | 73/514.32 |
| 8,205,498 | B2 * | 6/2012 | Hsu et al. | 73/514.32 |
| 8,333,113 | B2 * | 12/2012 | Classen et al. | 73/514.32 |
| 8,596,122 | B2 * | 12/2013 | Classen et al. | 73/514.32 |
| 8,689,633 | B2 * | 4/2014 | Classen | 73/514.32 |
| 8,863,575 | B2 * | 10/2014 | Frangi et al. | 73/514.32 |
| 2014/0144235 | A1 * | 5/2014 | Suzuki | 73/514.32 |
| 2014/0305211 | A1 * | 10/2014 | Malvern et al. | 73/514.32 |

FOREIGN PATENT DOCUMENTS

| | | |
|---|---|---|
| DE | 10 2007 060 878 | 6/2009 |
| DE | 10 2008 001 442 | 11/2009 |
| DE | 10 2009 045 391 | 4/2011 |

* cited by examiner

*Primary Examiner* — Helen Kwok
(74) *Attorney, Agent, or Firm* — Kenyon & Kenyon LLP

(57) ABSTRACT

A micromechanical component includes: a substrate; a seismic weight joined to the substrate at a first suspension mount; at least one first electrode for measuring a motion of the seismic weight in a first direction, the first electrode being joined to the substrate at a second suspension mount; and at least one second electrode for measuring a motion of the seismic weight in a second direction different from the first direction, the second electrode being joined to the substrate at a third suspension mount. The first electrode is mechanically connected to the second suspension mount with the aid of a support arm and set apart from the second suspension mount.

11 Claims, 12 Drawing Sheets

MICROMECHANICAL COMPONENT AND METHOD FOR MANUFACTURING A MICROMECHANICAL COMPONENT

BACKGROUND OF THE INVENTION

1. Field of the Invention

The present invention relates to a micromechanical component and a method for manufacturing a micromechanical component.

2. Description of Related Art

Micromechanical components and micromechanical structures or micromechanical systems are known, for example, from published German patent application documents DE 10 2009 045 391 A1, DE 10 2008 001 442 A1 and DE 10 2007 060 878 A1.

BRIEF SUMMARY OF THE INVENTION

According to one aspect of the present invention, a micromechanical component is provided. The micromechanical component includes a substrate and a seismic weight, which is joined to the substrate at a first suspension mount. In addition, at least one first electrode is provided for measuring a motion of the seismic weight in a first direction, the first electrode being joined to the substrate at a second suspension mount. Furthermore, the component includes at least one second electrode for measuring a motion of the seismic weight in a second direction different from the first direction, the second electrode being joined to the substrate at a third suspension mount. It is provided that with the aid of a support arm, the first electrode be mechanically connected to the second suspension mount and set apart from the second suspension mount.

According to a further aspect, a method for manufacturing a micromechanical component, in particular, the above-mentioned micromechanical component, is provided. The method may take the form of, in particular, a micromechanical method, i.e., a micromechanical manufacturing method. The method includes, in particular, a step of producing a seismic weight on a substrate, the seismic weight being joined to the substrate by a first suspension mount. In addition, at least one first electrode is produced for measuring a motion of the seismic weight in a first direction, the first electrode being joined to the substrate at a second suspension mount. Furthermore, at least one second electrode is produced for measuring a motion of the seismic weight in a second direction different from the first direction, the second electrode being joined to the substrate at a third suspension mount. It is provided that the first electrode be mechanically connected to the second suspension mount by a support arm, so that the first electrode is set apart from the second suspension mount.

Thus, the present invention encompasses, in particular, the concept of setting the first electrode apart from its corresponding, second suspension mount; a support arm being provided as a mechanical connection between the second suspension mount and the first electrode; in this respect, the support arm advantageously representing or forming a mechanical connection of the first electrode to the second suspension mount. In this respect, the support arm advantageously acts as a spacer between the first electrode and the second suspension mount. In particular, this therefore means that the first electrode is not mounted or fixed or anchored directly to the second suspension mount, but, on the contrary, set apart from the second suspension mount. In this respect, the support arm may also be referred to as, in particular, a spacer.

Because of the provision of such a support arm, the first electrode may be mounted or positioned independently of a position of the second suspension mount. As a rule, the further away the first electrode is situated from the first suspension mount of the seismic weight, the better or more sensitively the first electrode may detect or measure the motion of the seismic weight in the first direction. In this respect, the support arm may advantageously allow the first electrode to be situated far away from the first suspension mount. Sensitive detection of the motion of the seismic weight in the first direction is rendered possible in an advantageous manner.

According to one specific embodiment, it may be provided that the micromechanical component be configured as an acceleration sensor, in particular, a micromechanical acceleration sensor. That is to say that therefore, in particular, such a micromechanical component may detect or measure or determine an acceleration acting upon the seismic weight or the substrate.

According to one specific embodiment, it may be provided that the first direction corresponds to a spatial axis of a three-dimensional space. It may be preferably provided that the second direction corresponds to a second spatial axis of the three-dimensional space. Such a three-dimensional space may be defined by, in particular, a cartesian coordinate system. The first direction may preferably correspond to the y direction or y axis. In particular, the second direction may correspond to the x axis or x direction of the three-dimensional space.

In another specific embodiment, it may be provided that a distance between the first electrode and the second suspension mount be greater than a distance between the first suspension mount and the second suspension mount. Thus, this means that, in particular, the electrode suspension mount and the weight suspension mount are closer together than the first electrode and its corresponding electrode suspension mount. In this case, as a rule, the further a weight suspension mount, thus, in this case, the first suspension mount, and an electrode suspension mount, thus, in this case, the second suspension mount, are situated away from each other, the more markedly the electrode surfaces formed by the seismic weight and by the first electrode shift with respect to one another when the substrate deforms. In particular, this may then produce disadvantageous and unwanted changes in a so-called offset. In this instance, a so-called offset refers to, in particular, an output signal of the first electrode at an acceleration of 0 g. This means that therefore, in particular, the first electrode supplies or provides a signal, even though the micromechanical component is not being accelerated. In particular, in this case, the seismic weight especially does not move in the first direction. This signal of the first electrode is generated exclusively on the basis of the deformation of the substrate.

However, since, according to this specific embodiment, it is provided that a distance between the first electrode and the second suspension mount be greater than a distance between the first suspension mount and the second suspension mount, such an offset signal may advantageously be kept very small, which advantageously results in a more reliable acceleration measurement. In particular, it may be provided that the first suspension mount and the second suspension mount be situated directly adjacent to one another.

In another specific embodiment, a plurality of first electrodes may be provided, the second suspension mounts associated with these electrodes being situated symmetrically about the first suspension mount. By providing a plurality of first electrodes, a measurement or detection of a motion in the first direction may advantageously be accomplished even more sensitively. By positioning the second suspension mounts symmetrically about the first suspension mount, an available space is efficiently utilized in an advantageous manner. In particular, the symmetric arrangement produces a particularly uniform measuring signal of the first electrodes.

According to another specific embodiment, it may be provided that the support arm include branching, so that support-arm branches set apart from one another are formed; in each instance, at least one first electrode being situated at the support-arm branches. In particular, a plurality of first electrodes may also be situated at corresponding support-arm branches. In this manner, several first electrodes may be distributed over a wide region, using a single support arm. The support arm preferably has the shape of a fork. This means that therefore, in particular, the support-arm branches form the corresponding prongs of the fork. It may be advantageously provided that the support-arm branches include, for their part, one or more instances of branching, so that corresponding support-arm sub-branches are formed; in each instance, at least one first electrode preferably being situated at each of the support-arm sub-branches. The prongs of the fork are preferably positioned parallelly to one another. The support arm preferably has perpendicular branching, which means that a support-arm branch running perpendicular to the support arm is advantageously formed. One or more support-arm sub-branches, which preferably run perpendicular to the support-arm branch, may preferably be formed at this support-arm branch. This means that therefore, in particular, the support-arm branch may have, e.g., one or more instances of perpendicular branching.

According to another specific embodiment, it may be provided that the second electrode be mechanically connected to the third suspension mount and set apart from the third suspension mount by a further support arm. The variants made in connection with the support arm of the first electrode and the variants still to follow apply analogously to the further support arm of the second electrode.

In another specific embodiment, it may be provided that the seismic weight has a recess, inside of which the first and second suspension mounts are situated. The seismic weight is preferably joined to the first suspension mount by two bending springs, in particular, torsional bending springs; in each instance, the bending springs, preferably, the two torsional bending springs, running from the first suspension mount to sides of the recess opposite to one another, and, in a resting position of the seismic weight in which it is not deflected, in particular, the support arm is positioned parallelly to the bending springs, in particular, torsional bending springs.

In the sense of the present invention, a torsional bending spring functions, in particular, as a torsion spring and as a bending spring. The torsional bending spring preferably takes the form of an elastic beam. The provision of torsional bending springs has the particular advantage that due to its inertia, the seismic weight is deflected angularly or linearly with respect to the first suspension mount, as a function of the motion of the substrate. Therefore, using a single seismic weight, it is advantageously possible to measure or detect a motion, in particular, an acceleration, of the substrate with respect to the seismic weight. In this respect, a corresponding acceleration sensor may also be referred to as a multi-channel acceleration sensor; the channels standing for the x, y and z directions, which means that a multichannel acceleration sensor may measure or detect accelerations in the corresponding directions, that is, the x, y and/or z directions.

According to another specific embodiment, the first and the second suspension mounts are situated in a central region of the seismic weight; a dimension of the central region in a direction being, at a maximum, 60% of a dimension of the seismic weight in this direction. That is to say, in particular, that the central region only extends in a direction up to a certain, maximum percentage, in this case, 60% of the dimension or extension of the seismic weight in this very direction. The maximum dimension may be 60% or less. Preferably, the maximum dimension may be 40%, in particular, a maximum of 30%. The central region may preferably have different maximum dimensions in different directions, relative to the corresponding dimension of the seismic weight in the corresponding direction.

According to another specific embodiment, it may be provided that the third suspension mount be situated inside the recess, and that in particular, the further support arm be positioned perpendicularly to the support arm.

In another specific embodiment, a plurality of first electrodes may be provided, a portion of the plurality of the first electrodes being fixed in a first plane, and the other portion of the plurality of the first electrodes being fixed in a second plane, the first and second planes being situated one above the another, preferably in parallel. In this manner, a differential evaluation of the corresponding electrode signals of the first electrodes may be performed in an advantageous manner. In this connection, in response to a motion of the seismic weight, the one portion of the first electrodes will move away from corresponding counter-electrodes of the seismic weight, whereas the other portion will move closer to the counter-electrodes of the seismic weight. Therefore, different electrode signals are generated, which may then be differentially evaluated. It may preferably be provided that the portion and the other portion have an equal number of the plurality of the first electrodes. That is to say that therefore, in particular, half of the first electrodes are fixed in the first plane and the other half of the first electrodes are fixed in the second plane.

In the sense of the present invention, first electrodes denote, in particular, electrodes that measure a motion of the seismic weight in the first direction. In the sense of the present invention, second electrodes denote, in particular, electrodes that measure a motion of the seismic weight in the second direction. In the sense of the present invention, third electrodes denote, in particular, electrodes that measure a motion of the seismic weight in a third direction. In this connection, it may be provided that the first electrodes, the second electrodes and/or the third electrodes interact with corresponding counter-electrodes, which are situated at the seismic weight, in that in each instance, a capacitor is formed by the first electrodes, the second electrodes and/or the third electrodes and the corresponding counter-electrodes of the seismic weight, which means that a change in distance between the first, second and/or third electrode and the corresponding counter-electrode may be measured capacitively. The first direction preferably runs in the direction of the y axis. In particular, the second direction runs in the direction of the x axis. The third direction runs, for example, in the direction of the z axis. In this connection, the x, y and z axes refer to the x-y-z cartesian coordinate system.

According to a further specific embodiment, a plurality of first electrodes may be provided. According to a further specific embodiment, a plurality of second electrodes may be provided. According to another specific embodiment, a plurality of third electrodes may be provided. The first, second and third electrodes may each be formed to be different or the same. In particular, it may be provided that the first, the second and the third electrodes be formed to be the same or different. Variants relating to one of the first, second and the third electrodes also apply to the two other electrodes in an analogous manner. That is to say that therefore, in particular, variants with regard to the first electrode also apply analogously to the second and the third electrode. It may preferably be provided that in a manner analogous to the support arm or further support arm, the third electrodes be mechanically connected to a fourth suspension mount by another support arm and set apart from the fourth suspension mount. The corresponding variants relating to the support arm or further support arm apply to the other support arm in an analogous manner.

According to one specific embodiment, it may be provided that support arm have a perforation. In this manner, it may advantageously be ensured that during the manufacturing process, an etching agent, such as gaseous HF, may travel through the perforations of the support arm and reliably remove sacrificial oxide situated below the support arm. In this manner, the support arm is formed to be self-supporting and is advantageously decoupled from deformations of the substrate. Consequently, the above-mentioned offset errors are minimized.

In another specific embodiment, it may be provided that the support arm be rigid or stiff, so that the first electrode is rigidly connected to the substrate. In this respect, the first electrode may be referred to as a stationary electrode with respect to the counter-electrodes of the seismic weight, since in response to a deflection of the seismic weight, these move with respect to the first electrode. The same applies to the second and to the third electrode in an analogous manner.

DETAILED DESCRIPTION OF THE INVENTION

Figure 1:
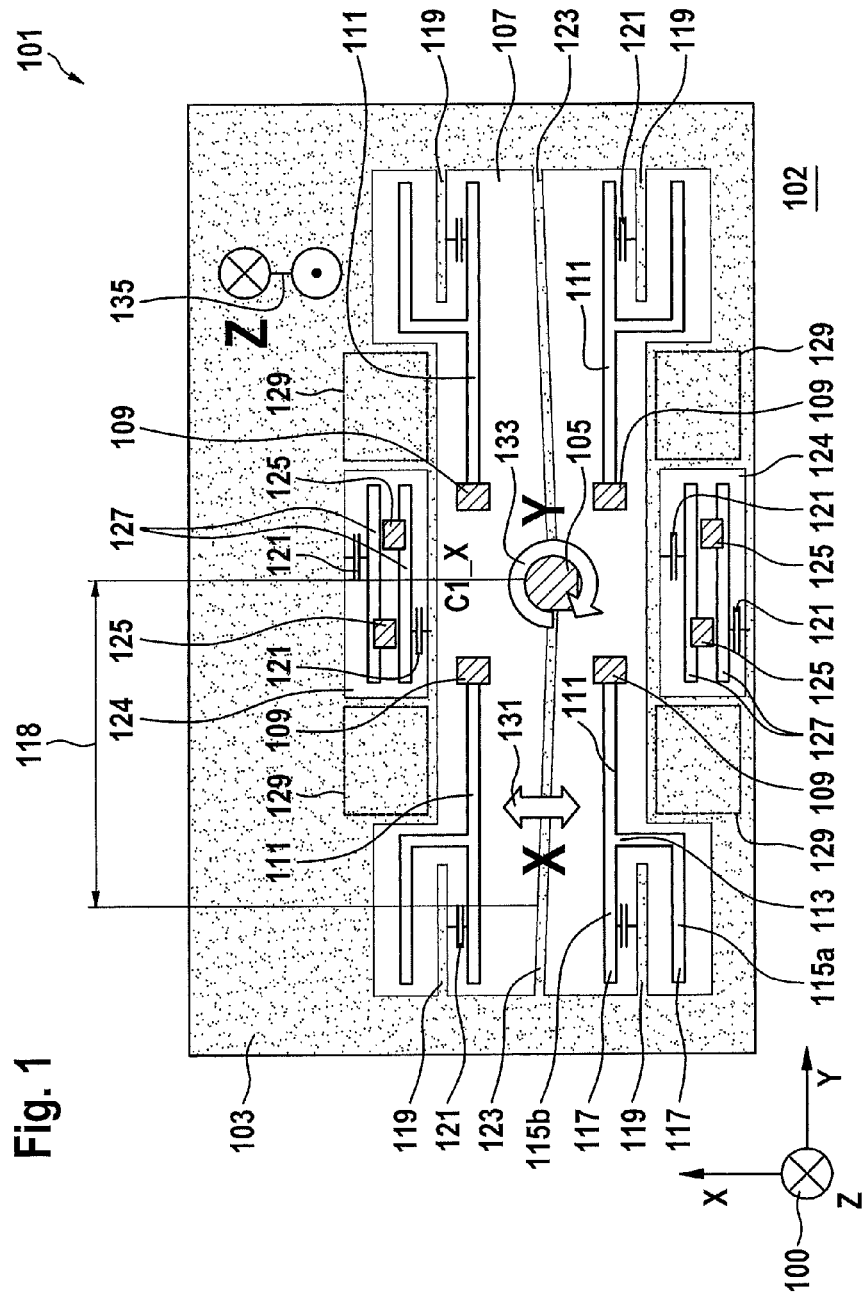
FIG. 1 shows a micromechanical component.

In the following, like reference numerals are used for the same features.

FIG. 1 shows a micromechanical component 101. For the sake of clarity, a cartesian coordinate system 100 is drawn in. The plane of the paper lies in the xy plane. The z direction is perpendicular to the plane of the paper.

Micromechanical component 101 includes a substrate 102, which is situated in the plane of the paper, thus, the xy plane. In addition, micromechanical component 101 includes a seismic weight 103, which is joined to substrate 102 at a first suspension mount 105. Seismic weight 103 has a rectangular shape. In a specific embodiment not shown, it may be provided that seismic weight 103 has a square shape. In a further specific embodiment not shown, it may be provided that seismic weight 103 has a circular shape or rounded-off shape.

First suspension mount 105 is situated inside of a recess 107 of seismic weight 103 and joined to substrate 102.

Four second suspension mounts 109 joined to substrate 102 are formed, which are positioned inside of recess 107 and symmetrically about first suspension mount 105. In this connection, the four second suspension mounts 109 form four corners of a rectangle, preferably a square; first suspension mount 105 then being situated, in particular, in the center of the square or rectangle.

A support arm 111 runs from each of the four second suspension mounts 109 in the longitudinal direction of recess 107, that is, therefore, in the direction of the greatest dimension of recess 107. In this case, support arms 111 run parallel to the y axis, thus, parallel to the long side of seismic weight 103.

Each of the support arms 111 include branching 113, which means that in each instance, two support-arm branches 115a and 115b are formed. In this respect, support arms 111 are fork-shaped, support-arm branches 115a and 115b preferably being able to form the prongs of the fork.

First electrodes 117 are situated at or attached to support-arm branches 115a and 115b, respectively. In each instance, a counter-electrode 119, which is joined to seismic weight 103, lies diametrically opposed to first electrodes 117. In this respect, the corresponding electrode surfaces of first electrodes 117 and counter-electrodes 119 advantageously form a capacitor, which, in this case, is symbolically denoted by a capacitor symbol having the reference numeral 121. Therefore, a change in distance between the corresponding electrode surfaces, thus, between first electrodes 117 and associated counter-electrode 119, may be measured capacitively in an advantageous manner.

In addition, two torsional bending springs 123 are provided, which run parallel to the y axis when seismic weight 103 is in a resting position. This means that therefore, in particular, seismic weight 103 is not deflected, since no external forces act upon seismic weight 103. The two torsional bending springs 123 run diametrically opposed from first suspension mount 105 to respective sides of recess 107 facing one another. Consequently, seismic weight 103 is elastically suspended at first suspension mount 105 in an advantageous manner by the two torsional bending springs 123.

Furthermore, four third suspension mounts 125 are provided, in each instance, two of the four third suspension mounts 125 being situated in each of two further recesses 124, the two further recesses 124 being formed separately from recess 107.

A second electrode 127 is attached directly to each of the third suspension mounts 125, which are joined to substrate 102. In a manner analogous to first electrodes 117 and counter-electrodes 119, the corresponding electrode surfaces of second electrodes 127 and the associated electrode surfaces of counter-electrodes of seismic weight 103, which are not shown here in detail, form a capacitor, which, in this case, is also denoted by capacitor symbol 121. In this respect, a change in distance between second electrodes 127 and the corresponding counter-electrode may also be measured capacitively in this case.

In FIG. 1, third electrodes, which are situated on substrate 102, are represented with hatching and denoted by reference numeral 129.

In response to a motion or acceleration of substrate 102, which includes a component along the y axis, the two torsional bending springs 123 will deflect oppositely, which means that seismic weight 103 rotates in the xy plane and about an axis that runs perpendicularly along the z direction, through first suspension mount 105. This being the case, the distances between first electrodes 117 and counter-electrodes 119 will then change, which may be measured capacitively in an advantageous manner. In this respect, first electrodes 117 advantageously measure a motion or a motion component of substrate 102 in a first direction, that is, in this case, the y direction.

In response to a motion or acceleration of substrate 102, which includes a component in the x direction, the two torsional bending springs 123 will not bend oppositely, but simultaneously in the positive x direction or negative x direction, which means that seismic weight 103 undergoes a translatory motion in the x direction. This being the case, the corresponding distances between second electrodes 127 and the corresponding counter-electrodes at seismic weight 103 will then change, which may also be measured capacitively. In this respect, second electrodes 127 advantageously measure a motion of substrate 102 in a second direction, in this case, the x direction, which is different from the first direction, in this case, the y direction.

In response to a motion or acceleration of substrate 102, which includes a component in the z direction, torsional bending springs 123 will twist about the y axis, which means that seismic weight 103 then tilts or rocks out of the plane of the paper, thus, out of the xy plane. A change in distance between third electrodes 129 and corresponding counter-electrodes of seismic weight 103 may then be measured capacitively in an analogous manner. In this respect, third electrodes 129 measure a motion of substrate 102 in a third direction, which is different from the first and the second directions. In this case, the third direction is the z direction.

In general and, in particular, apart from the above-mentioned exemplary embodiment, it may be provided that first electrode 117 be able to measure a motion, in particular, an acceleration of substrate 102, which includes a component in a first direction, for example, the y direction. In general and, in particular, apart from the above-mentioned exemplary embodiment, it may be provided that second electrode 127 be able to measure a motion, in particular, an acceleration of substrate 102, which includes a component in a second direction, for example, the x direction. In general and, in particular, apart from the above-mentioned exemplary embodiment, it may be provided that third electrode 129 be able to measure a motion, in particular, an acceleration of substrate 102, which includes a component in a third direction, for example, the z direction.

Consequently, micromechanical component 101 may advantageously detect a motion, preferably, an acceleration, of substrate 102 in all three spatial directions, i.e., the x, y and z directions, using a single seismic weight 103. In this respect, a correspondingly configured acceleration sensor may also be referred to as a multichannel, in this case, in particular, as a three-channel acceleration sensor. Such a micromechanical component 101 may also be referred to as, for example, a single-weight resonator, since a single seismic weight is used for detecting a motion, in particular, an acceleration of the substrate in all three spatial directions.

In this case, the translation of seismic weight 103 is represented by a double arrow having the reference numeral 131. A rotation of seismic weight 103 about first suspension mount 105 for detecting a motion in the y direction is represented here symbolically by a circular arrow having the reference numeral 133. A tilting of seismic weight 103 for detecting a z motion of substrate 102 is represented here symbolically by two vector arrow symbols having the reference numeral 135.

As a rule, the further away first electrodes 117 are from first suspension mount 105, i.e., from the corresponding axis of rotation, the greater a corresponding sensor signal of first electrodes 117 is.

This being the case, using support arms 111, a corresponding, second suspension mount 109 of first electrodes 117 may be positioned centrally, thus, in the vicinity of first suspension mount 105, and at the same time, the detecting electrode surfaces may be situated at a greater distance, in this case, distance 118, from the axis of rotation, in order to ensure a sufficiently high output signal or electrode signal. In this manner, markedly improved offset characteristics may be obtained in comparison with the known design of known micromechanical components.

Figure 2:
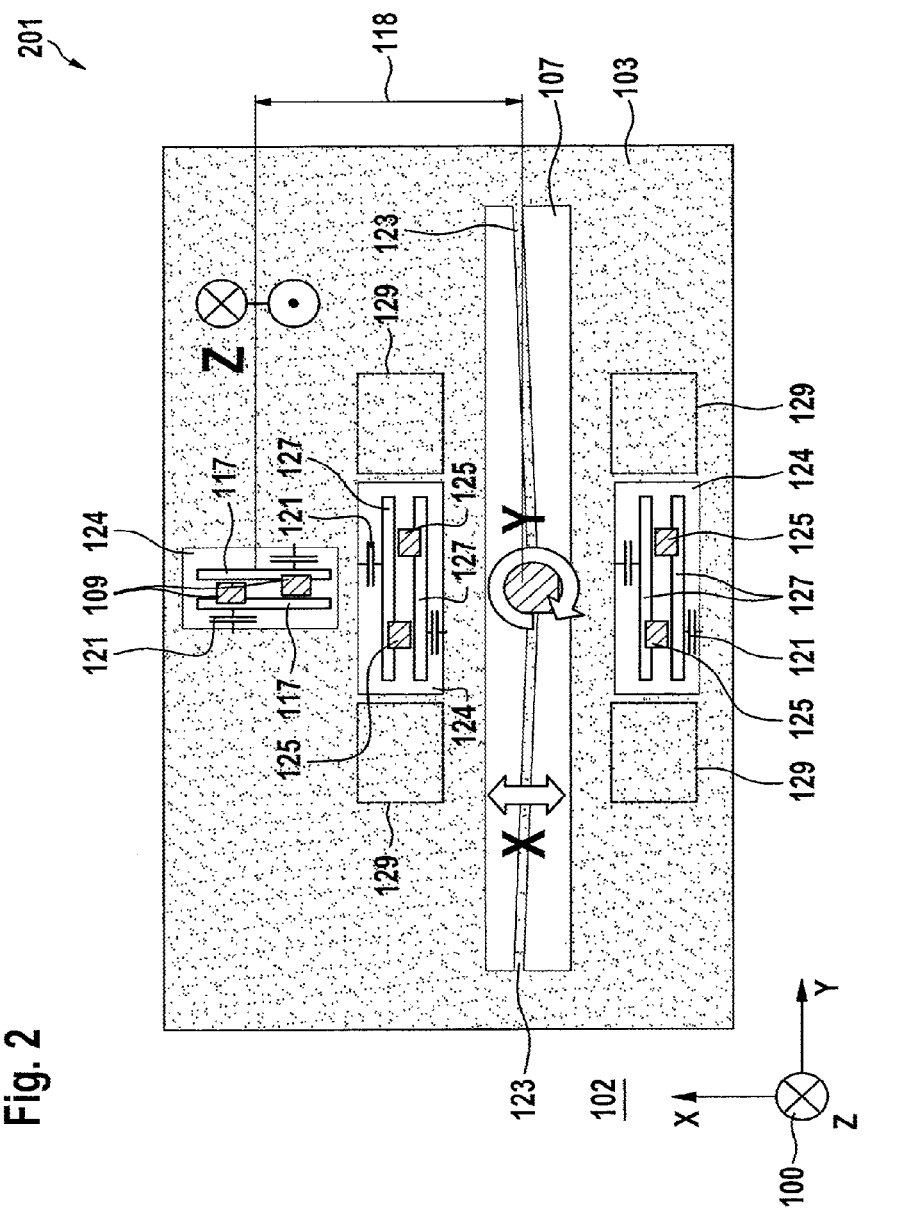
FIG. 2 shows a micromechanical component according to the related art.

In comparison, FIG. 2 shows a micromechanical component 201 according to the related art. Micromechanical component 201 is constructed in a manner partially analogous to micromechanical component 101. This being the case, the same reference numerals are used. In addition, reference may also be made to the corresponding explanations.

In contrast, electrodes 117 of micromechanical component 201 according to the related art are situated in further recesses 124, far away from first suspension mount 105. In this connection, first electrodes 117 are attached directly to the corresponding, second suspension mounts 109, which are also situated inside of further recess 124. This means that therefore, in particular, in comparison with micromechanical component 101 according to FIG. 1, first electrodes 117 of micromechanical component 201 according to the related art are far away from first suspension mount 105 of seismic weight 103. Such a micromechanical component 201 according to the related art is described, for example, in the published German patent application document DE 10 2008 001 442 A1.

The advantage of micromechanical component 101 of FIG. 1 over micromechanical component 201 of the related art, shown in FIG. 2, is, in particular, that an output signal of a corresponding sensor has a comparatively low sensitivity to unwanted influences of the package or the packaging, for example, a stress-induced deformation of substrate 102 due to soldering processes or temperature changes. As a rule, the further away first suspension mount 105 and second suspension mount 109 are from one another, the more markedly the electrode surfaces formed by seismic weight 103 and first electrodes 117 move relative to one another when substrate 102 deforms. In particular, such a remote configuration may produce unwanted changes in the so-called offset, that is, in the output signal or electrode signal at an acceleration of 0 g.

However, since support arms are provided in the micromechanical component 101 according to FIG. 1, corresponding, first electrode 117 may be simultaneously suspended centrally, and at the same time, first electrode 117 may be situated far away from a corresponding axis of rotation, in this case, first suspension mount 105. This advantageously ensures a sufficient robustness of a sensor output signal with respect to packaging effects, such as a stress-induced deformation of substrate 102. In particular, the above-mentioned offset errors are minimized in this manner.

Figure 3:
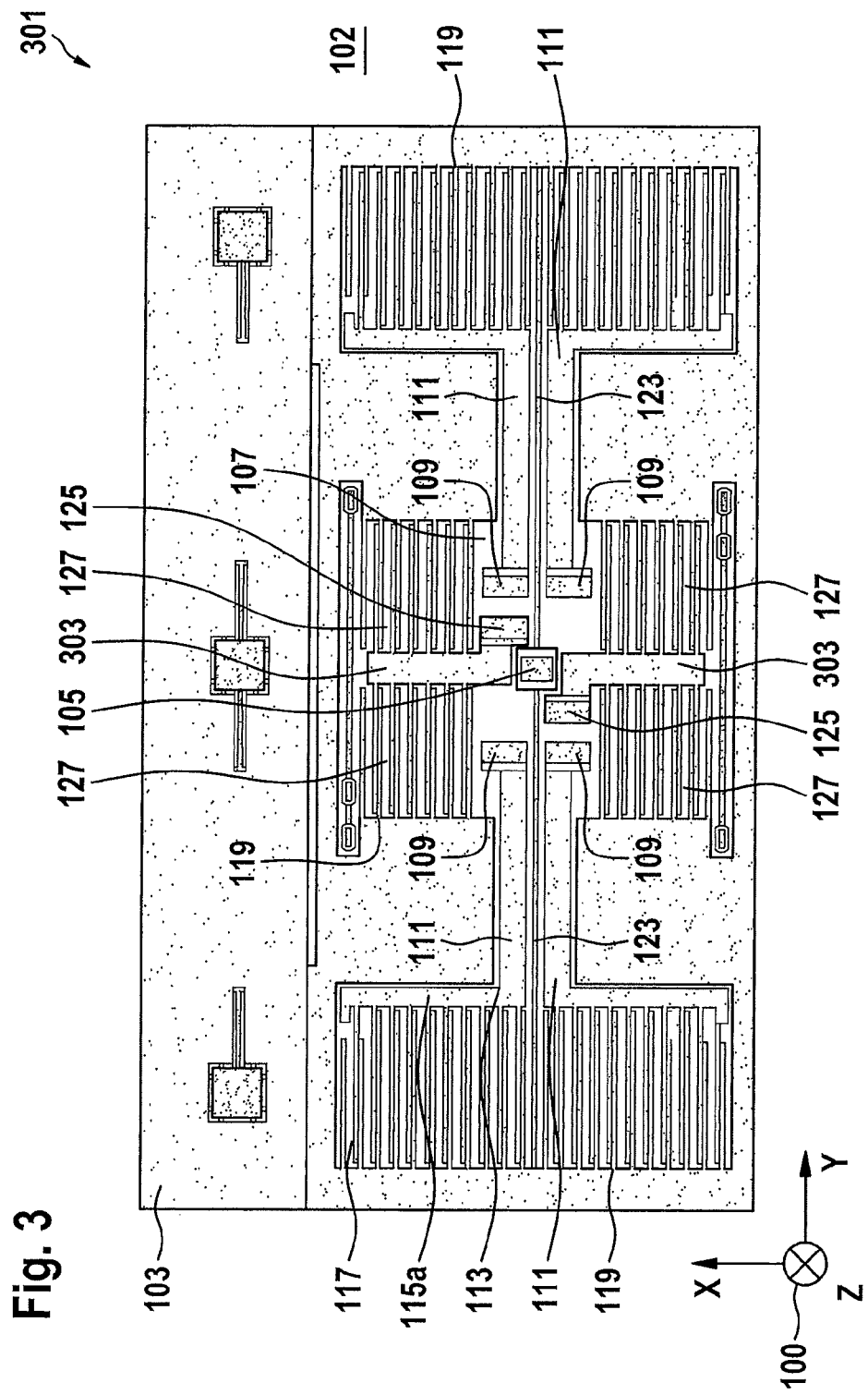
FIG. 3 shows a further micromechanical component.

FIG. 3 shows a further micromechanical component 301. In this case, in a manner analogous to component 101 according to FIG. 1, first electrodes 117 are also joined by a respective support arm 111 to a second suspension mount 109, which is situated in a central region around first suspension mount 105. In this connection, support arm 111 includes perpendicular branching 113, which means that a support-arm branch 115a is formed, at which a plurality of first electrodes 117 is positioned, in turn, at right angles to support-arm branch 115a.

As a further development with respect to micromechanical component 101 according to FIG. 1, second electrodes 127 in micromechanical component 301 according to FIG. 3 are joined to their associated, third suspension mount 125 by a respective, further support arm 303. In this connection, further support arms 303 run parallel to the x axis and perpendicular to support arms 111. Second electrodes 127 are positioned at further support arm 303, at right angles to it. Consequently, second electrodes 127 may also be suspended centrally in an advantageous manner, but at the same time, away from first suspension mount 105 as well, which advantageously increases a magnitude of a corresponding sensor signal or electrode signal.

Figure 4:
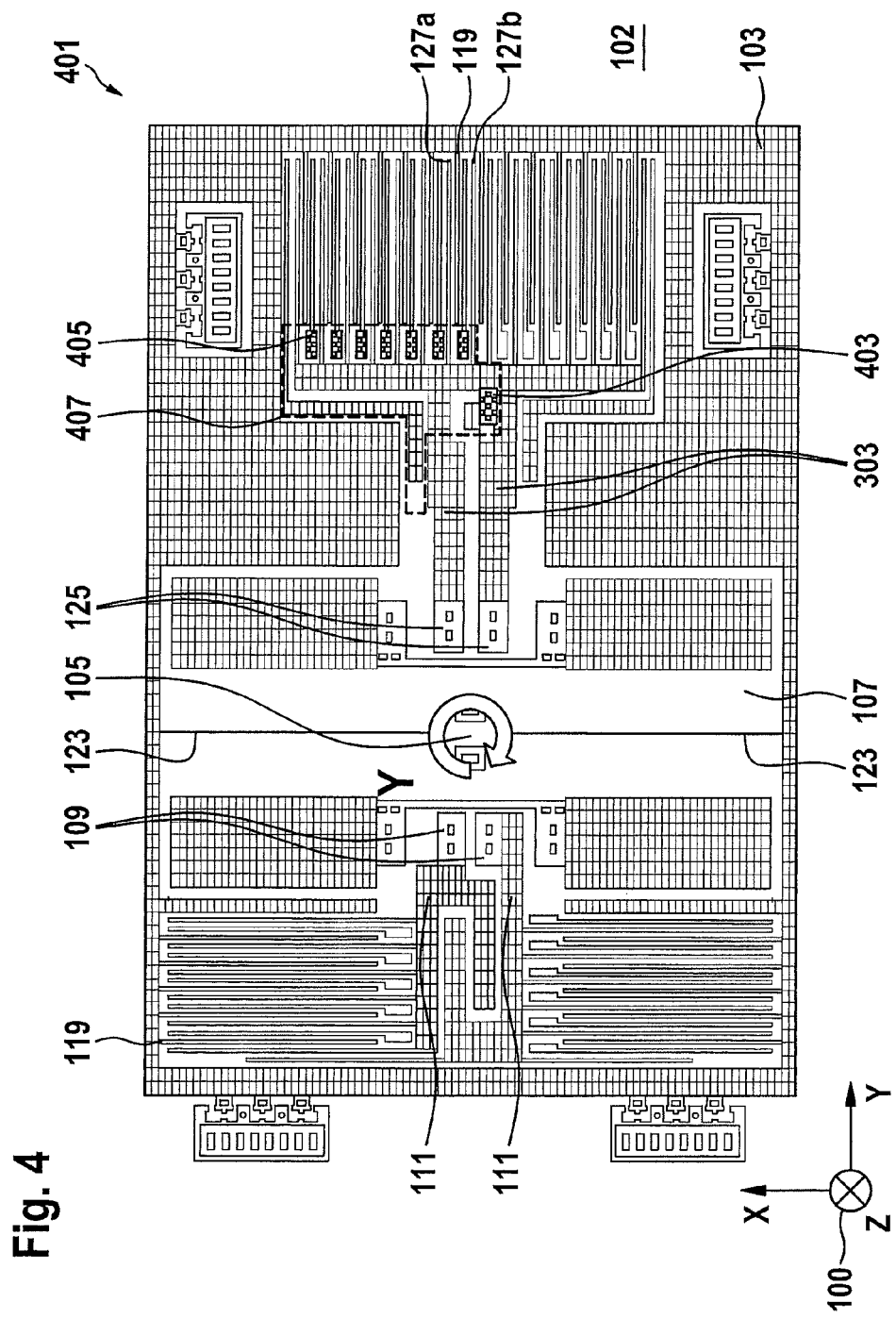
FIG. 4 shows another micromechanical component.

FIG. 4 shows another micromechanical component 401. In this case, the one half of the second electrodes 127 is situated in a first functional layer or plane. These second electrodes are denoted here by reference numeral 127a. Using a second functional layer 407, which is represented here with hatching, the other half of the second electrodes 127 are connected, via contacts 403 and 405 between the two functional layers, to the third suspension mounts 125 fixed to the substrate. In this connection, the first functional layer is situated above second functional layer 407. In this manner, the same capacitance density as for the related art may be obtained while retaining a central suspension mount, if a second electrode 127, i.e., 127a and 127b, is situated on the two sides of counter-electrode 119 of seismic weight 103, respectively. In this respect, a differential evaluation of the corresponding electrode signals is rendered possible in an advantageous manner. Second functional layer 407, which, in FIG. 4, may be situated underneath the first functional layer but may also be situated above the first functional layer in an exemplary embodiment not shown, is advantageously used here as a support for second electrodes 127, which means that two stationary, differential second electrodes 127a and 127b may be situated on the two sides of movable counter-electrodes 119. At this point, it is noted that for the sake of simplicity and clarity, only a portion of second functional layer 407 is shown in FIG. 4.

Because of this configuration, two detection capacitances changeable in opposition are available for a post-connected evaluation circuit for second electrodes 127, which is not shown here. This concept may also be preferably used for the other spatial directions, thus, in particular, for the y and z directions. Therefore, this allows a differential signal analysis having the advantage of a linear output signal or electrode signal with simultaneously improved suppression of fluctuations in a manufacturing process.

Since, according to FIG. 4, the one half of the second electrodes 127 is situated or fixed in a first functional layer and the second half of second electrodes 127 is situated or fixed in a second functional layer 407, an available space or available surface is advantageously utilized, which means that a sufficient capacitance density per surface on a sensor chip may be obtained, so that the manufacturing costs for such a sensor chip decrease in an advantageous manner.

In particular, further support 303 having second electrodes 127b is situated in the upper functional layer.

FIGS. 5 to 11 each show the micromechanical component 401 according to FIG. 4, where the individual elements are successively added. For the sake of clarity, not all of the reference numerals are always drawn into the individual figures.

Figure 5:
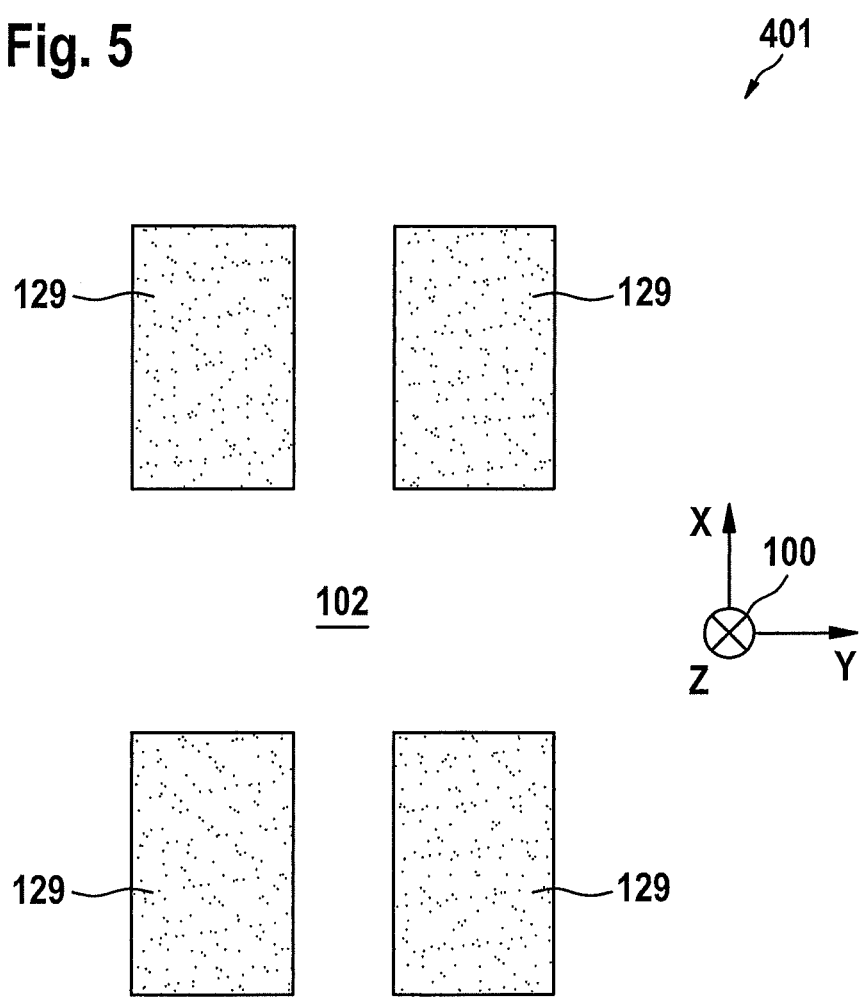
FIGS. 5-11 show in each instance, the micromechanical component according to FIG. 4, where the individual elements are successively added to the individual figures.

Thus, FIG. 5 simply shows third electrodes 129 on substrate 102, which are used for detecting a tilting motion of seismic weight 103 out of the xy plane, so that a motion of substrate 102 in the z direction may be measured in an advantageous manner.

Figure 6:
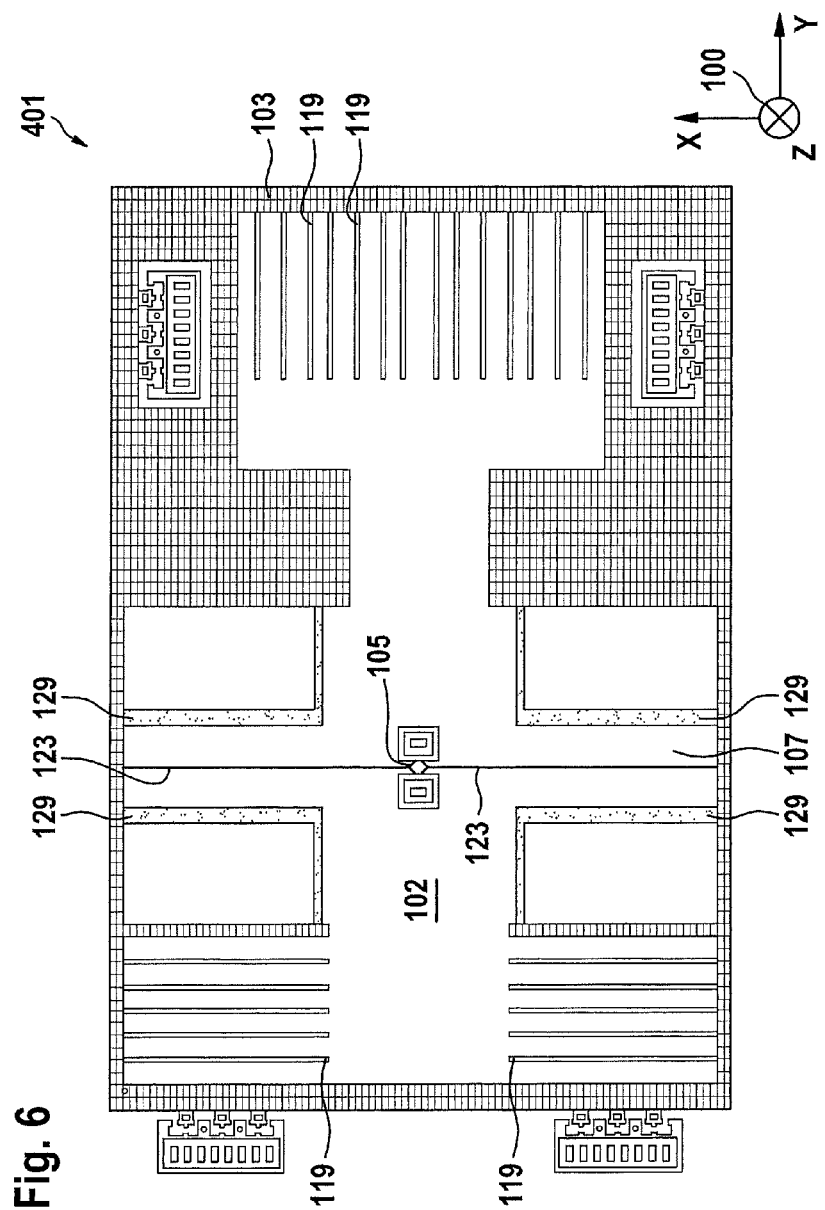

FIG. 6 then additionally shows seismic weight 103. Counter-electrodes 119 of seismic weight 103 are easily recognized here. In general, counter-electrodes 119 may also especially be referred to as movable electrodes, since they move together with seismic weight 103 in the event of a corresponding deflection. Seismic weight 103 is elastically suspended at a first suspension mount 105, using two torsional bending springs 123; first suspension mount 105 being joined to substrate 102.

Figure 7:
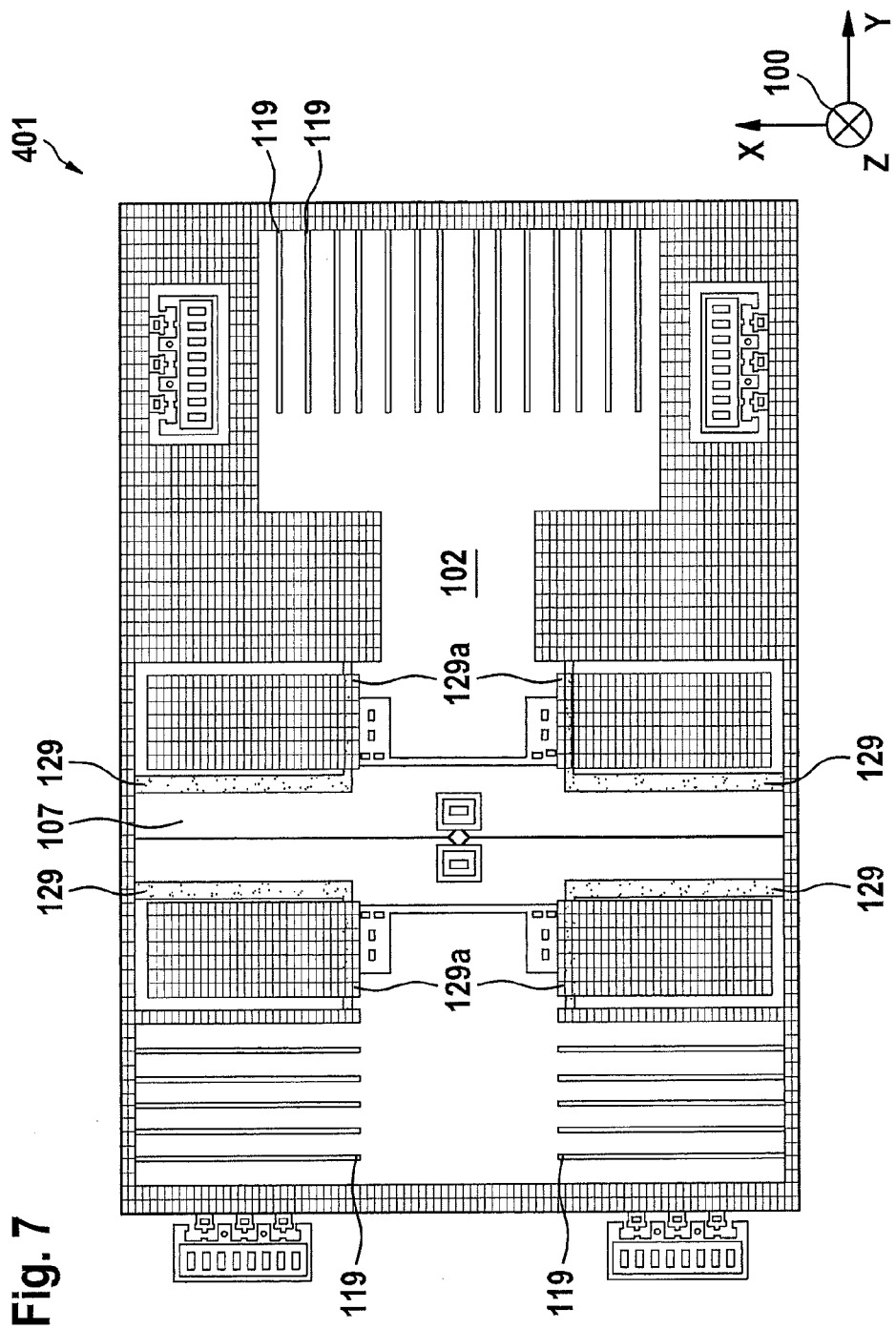

FIG. 7 shows further third electrodes 129a, which are situated above the third electrodes and set apart from these third electrodes 129 of substrate 102; these further third electrodes 129a being used for measuring a tilting motion of seismic weight 103 out of the xy plane. In this respect, using this set-up as well, it is possible to differentially evaluate the corresponding electrode signals in the event of a tilting motion of seismic weight 103 out of the xy plane.

Figure 8:
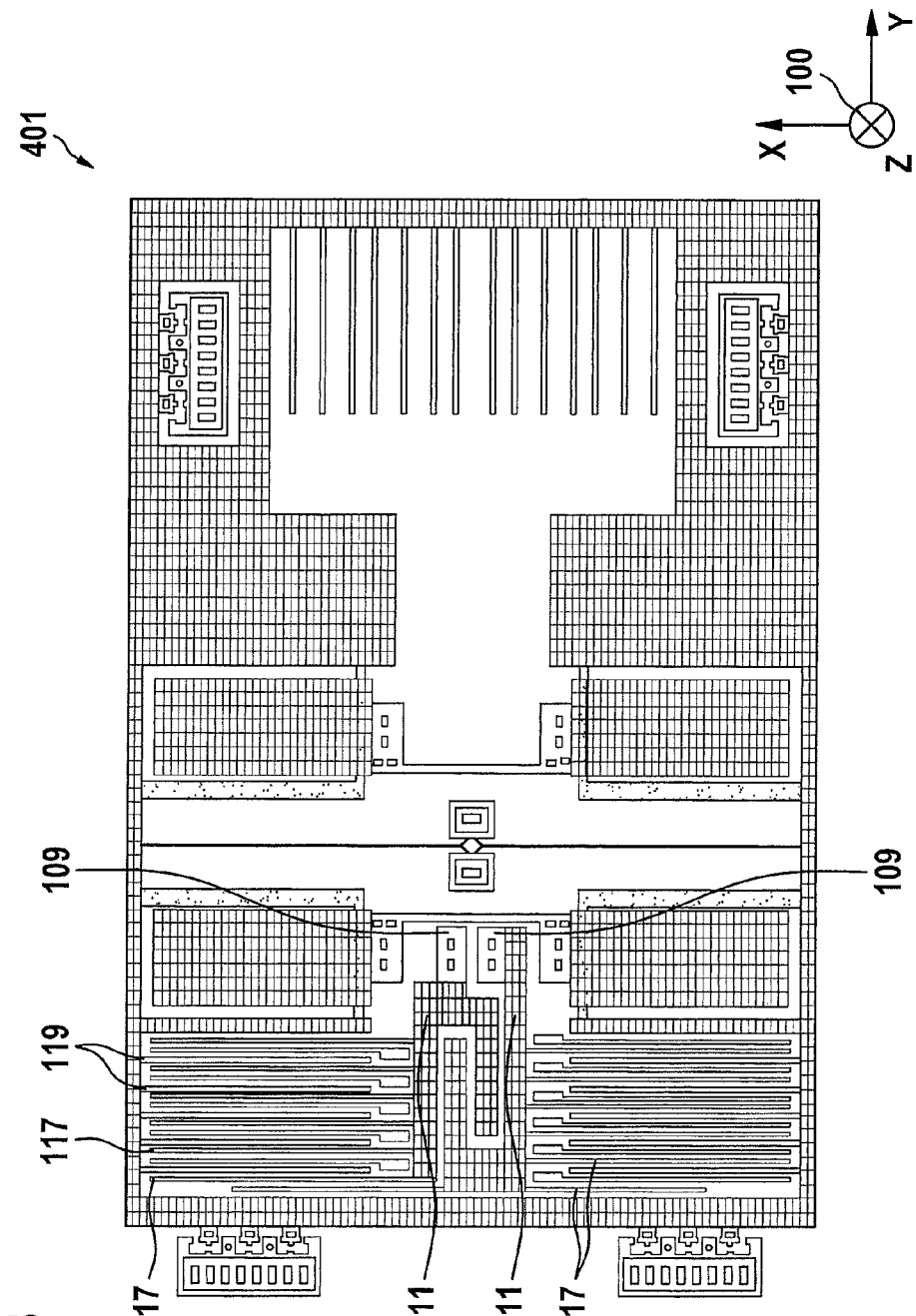

FIG. 8 shows first electrodes 117 along with their corresponding suspension by a support arm 111 at a second suspension mount 109.

Figure 9:
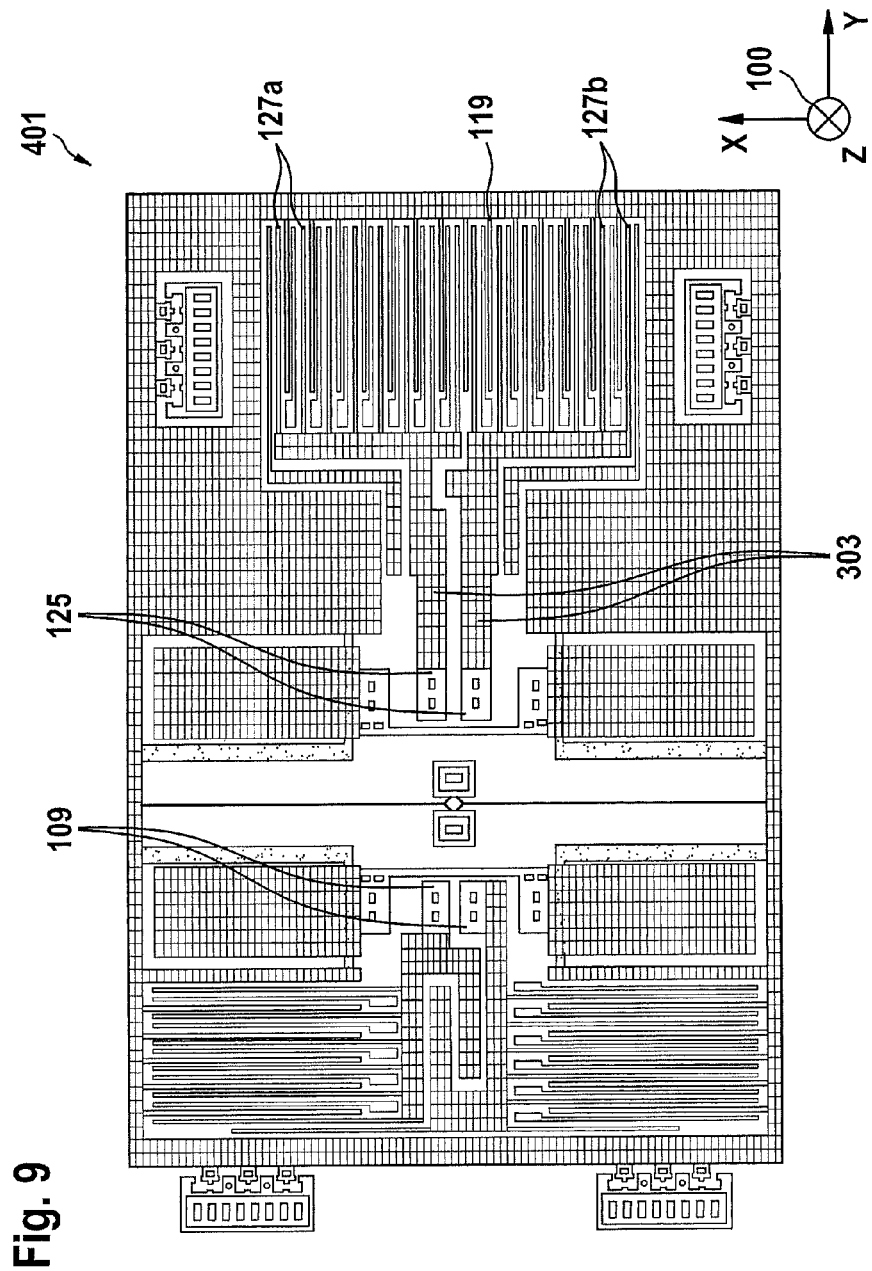

FIG. 9 shows second electrodes 127, in this case, in particular, electrodes 127a of the first half and electrodes 127b of the second half, in the respective functional layers.

Figure 10:
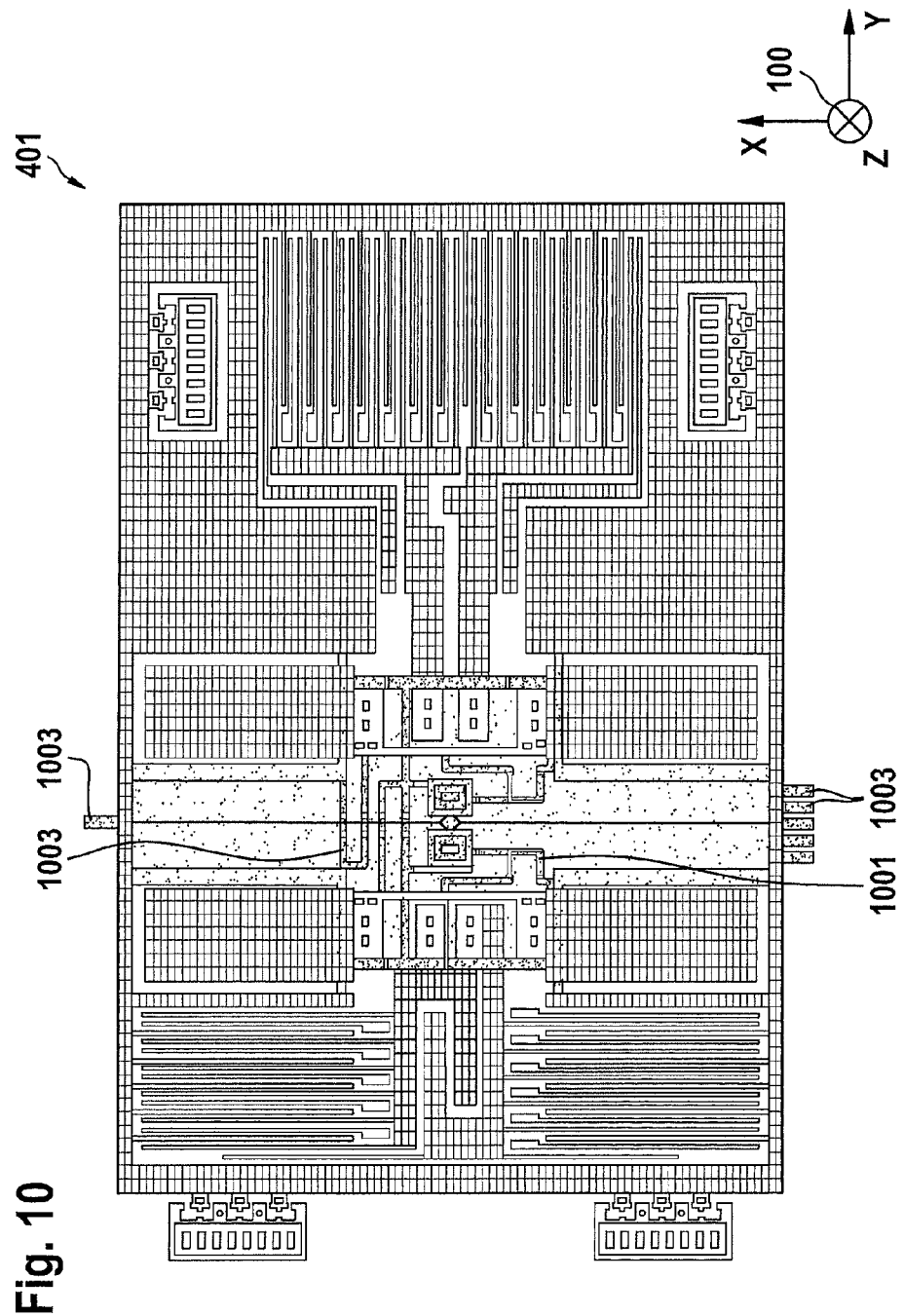

FIG. 10 shows wiring 1001 and conductor tracks 1003 for contacting the various electrodes, in this case, in particular, first 117, second 127 and third electrodes 129.

Figure 11:
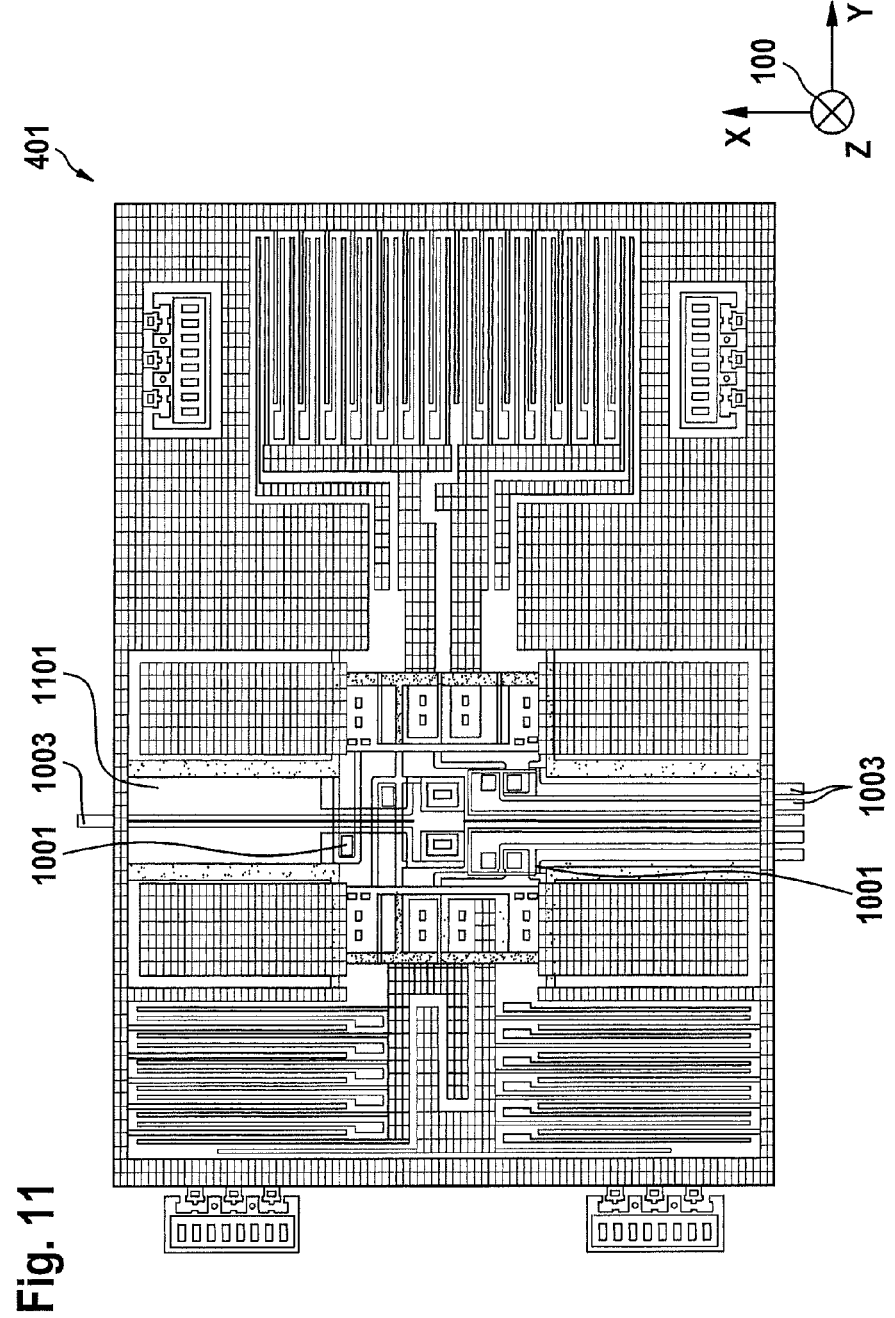

FIG. 11 shows how upper conductor track plane 1101 may be used as a shield for the conductor tracks that are situated below it and are not illustrated in detail. In particular, using this shield 1101, electrical shielding is, first of all, rendered possible in an advantageous manner. Secondly, in particular, when the shielding is laid over the corresponding conductor tracks in a planar manner, protection of these conductor tracks from overly intense undercutting during oxide etching is advantageously rendered possible. In order to form silicon structures so as to be movable, as a rule, an oxide situated under them must be removed. This may be carried out, for example, by etching with gaseous HF. In the process, the oxide below these conductor tracks may also be attacked. However, since these conductor tracks are supposed to remain securely joined to substrate 102, or else they would be very fragile due do their low thickness and would also buckle, as a rule, they must normally have a large width of several tens of $\mu$m. If, however, one or more of these narrow conductor tracks is protected by a wide shield, the etching gas may no longer travel below the conductor tracks, or only with a long delay, which means that the oxide situated underneath them is advantageously attacked to a lesser extent up to not at all. Therefore, this advantageously allows narrower conductor tracks having correspondingly lower parasitic capacitances, which means that several conductor tracks may be simultaneously accommodated on the same surface, in order to construct even smaller sensor cores in an advantageous manner.

Figure 12:
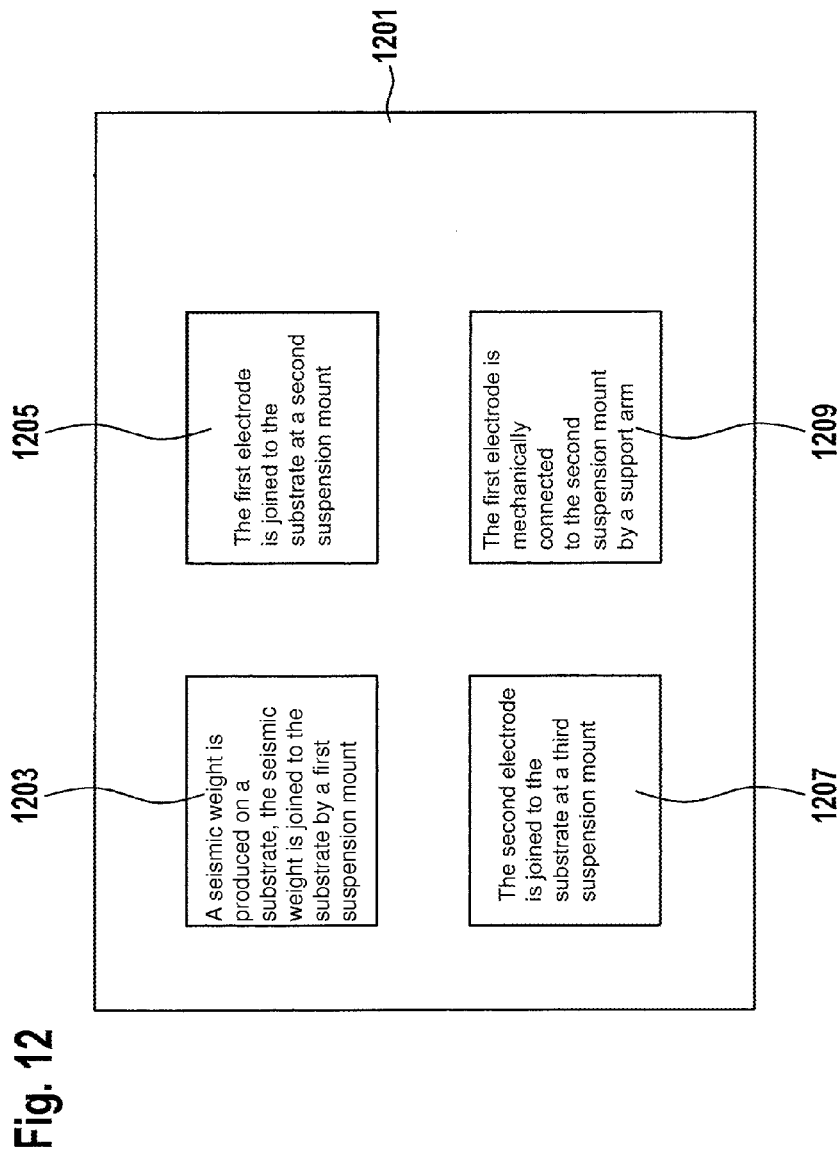
FIG. 12 shows a block diagram of a method for manufacturing a micromechanical component.

FIG. 12 shows a block diagram 1201 of a method for manufacturing a micromechanical component, in particular, for manufacturing one of the above-mentioned micromechanical components.

According to a step 1203, a seismic weight is produced on a substrate, the seismic weight being joined to the substrate by a first suspension mount. According to a step 1205, at least one first electrode is produced for measuring a motion of the seismic weight in a first direction, the first electrode being joined to the substrate at a second suspension mount. In a step 1207, at least one second electrode is produced for measuring a motion of the seismic weight in a second direction different from the first direction, the second electrode being joined to the substrate at a third suspension mount. According to a step 1209, the first electrode is mechanically connected to the second suspension mount by a support arm, so that the first electrode is set apart from the second suspension mount.

In particular, the above-mentioned steps 1203, 1205, 1207 and 1209 may be executed simultaneously or at different times.

What is claimed is:

1. A micromechanical component, comprising:
a substrate;

a seismic weight joined to the substrate at a first suspension mount;

at least one first electrode for measuring a motion of the seismic weight in a first direction, the first electrode being joined to the substrate at a second suspension mount; and at least one second electrode for measuring a motion of the seismic weight in a second direction different from the first direction, the second electrode being joined to the substrate at a third suspension mount;

wherein the first electrode is set apart from the second suspension mount and mechanically connected to the second suspension mount with the aid of a support arm; and wherein a distance between the first electrode and the second suspension mount is greater than a distance between the first suspension mount and the second suspension mount.

2. The micromechanical component as recited in claim 1, wherein multiple first electrodes and corresponding multiple second suspension mounts are provided, and the second suspension mounts associated with the first electrodes are situated symmetrically about the first suspension mount.

3. The micromechanical component as recited in claim 2, wherein the support arm includes support-arm branches set apart from one another, and wherein at least one first electrode is situated at each support-arm branch.

4. The micromechanical component as recited in claim 1, wherein the second electrode is set apart from the third suspension mount and mechanically connected to the third suspension mount with the aid of a further support arm.

5. The micromechanical component as recited in claim 4, wherein the seismic weight has a recess, and wherein the first and the second suspension mount are situated inside the recess.

6. The micromechanical component as recited in claim 5, wherein:

the seismic weight is joined to the first suspension mount by two torsional bending springs extending from the first suspension mount to respective sides of the recess lying diametrically opposed to each other; and in a resting position of the seismic weight in which the seismic weight is not deflected, the support arm is parallel to the torsional bending springs.

7. The micromechanical component as recited in claim 1, wherein:

the first and second suspension mounts are situated in a central region of the seismic weight; and the central region has a maximum dimension of 60% of a dimension of the seismic weight in a selected direction.

8. The micromechanical component as recited in claim 6, wherein the third suspension mount is situated inside of the recess, and the further support arm is positioned perpendicular to the support arm.

9. The micromechanical component as recited in claim 1, wherein:

multiple first electrodes are provided;

a first portion of each of the first electrodes is fixed in a first plane;

a second portion of each of the first electrodes is fixed in a second plane; and the first and second planes are positioned one above the other.

10. The micromechanical component as recited in claim 9, wherein the micromechanical component is formed as an acceleration sensor.

11. A method for manufacturing a micromechanical component, comprising:

producing a seismic weight on a substrate, the seismic weight being joined to the substrate by a first suspension mount;

producing at least one first electrode for measuring a motion of the seismic weight in a first direction, the first electrode being joined to the substrate at a second suspension mount; and producing at least one second electrode for measuring a motion of the seismic weight in a second direction different from the first direction, the second electrode being joined to the substrate at a third suspension mount;

wherein the first electrode is mechanically connected to the second suspension mount by a support arm, so that the first electrode is set apart from the second suspension mount; and wherein a distance between the first electrode and the second suspension mount is greater than a distance between the first suspension mount and the second suspension mount.

* * * * *